United States Patent [19]
Hoshino

[11] Patent Number: 4,571,661
[45] Date of Patent: Feb. 18, 1986

[54] SEMICONDUCTOR VIBRATION DETECTION DEVICE WITH LEVER STRUCTURE

[75] Inventor: Shigeo Hoshino, Yokosuka, Japan

[73] Assignee: Nissan Motor Co., Ltd., Yokohama, Japan

[21] Appl. No.: 646,166

[22] Filed: Aug. 31, 1984

[30] Foreign Application Priority Data

Sep. 7, 1983 [JP] Japan ................................ 58-163270

[51] Int. Cl.$^4$ .......................... H01G 7/00; H01L 29/84
[52] U.S. Cl. ........................................ 361/283; 357/26
[58] Field of Search ........................... 361/283; 357/26; 177/210 C; 73/DIG. 1

[56] References Cited
U.S. PATENT DOCUMENTS 3,761,784  9/1973  Jund ....................................... 357/26

OTHER PUBLICATIONS

I.B.M. Technical Disclosure Bulletin, vol. 9, No. 11, Apr. 1967, p. 1651.
International Electron Devices Meeting Technical Digest Washington, D.C., Dec. 7, 1980, pp. 673–675.
Micromechanical Accelerometer Integrated with MOS Detection Circuitry, Petersen et al.

*Primary Examiner*—Donald A. Griffin
*Attorney, Agent, or Firm*—Schwartz, Jeffery, Schwaab, Mack, Blumenthal & Evans

[57] ABSTRACT

A semiconductor vibration detection device according to the present invention includes a movable lever which is supported by the semiconductor base with at least one of its ends and includes a vibrating part that extends, with an incorporated electrode, approximately parallel to the semiconductor base, and a fixed electrode layer which is provided on the semiconductor base opposite to the movable lever. The movable lever has a triple layer structure in which the middle section is a polysilicon layer that is formed to be alkali-etching-proof and a top and a bottom layers that are sandwiching the middle layer are also of alkali-etching-proof.

7 Claims, 18 Drawing Figures

SEMICONDUCTOR VIBRATION DETECTION DEVICE WITH LEVER STRUCTURE

BACKGROUND OF THE INVENTION

1. Field of the Invention

The present invention relates to a semiconductor vibration detection device which detects vibration by means of a movable lever installed on a semiconductor base so as to allow a part of the lever to be free to vibrate, in particular, to a process for manufacturing the detection device which makes it possible to produce the movable lever accurately.

2. Description of the Prior Art

In recent years, demand for detecting machinery vibrations with high precision has been increasing. In particular, need has been in existence for a vibration detection device which is capable of measuring minute vibration in a reliable manner.

The present inventor has previously invented a vibration detection device as is disclosed in Japanese Patent Publication, No. 57-148874/1981. The vibration detection device includes a semiconductor base and a movable lever which is installed on the semiconductor base with at least one of its ends fixed to the semiconductor base so as to allow a part of it to be free to vibrate. On the vibrating part of the movable lever, there is provided an electrode layer in the form of one united body. On the semicondcutor surface, opposite to the movable lever, these is also prepared a fixed electrode layer. In this way, a condenser is formed by the electrode layer on the movable lever and the electrode layer on the semiconductor base. This makes it possible to detect vibrations to the device, through measurement of the variations in the condenser capacity due to vibrations of the movable lever. The above described type of a vibration detection device is extremely effective. However, there has not yet been found a method of manufacturing such a device with high precision in an easy way and a concrete lever structure facilitate the manufacturing of the device.

SUMMARY OF THE INVENTION

An object of the present invention is to provide a method of manufacturing a semiconductor vibration detection device which allows with high accuracy to obtain a movable lever.

Another object of the present invention is to provide a semiconductor vibration detection device is capable of manufacturing a movable lever in a short time at an inexpensive cost.

Another object of the present invention is to provide a semiconductor vibration detection device is capable of enhancing strength of a lever against the forces applied to it in the lateral direction.

Still another object of the present invention is to provide a semiconductor vibration detection device which is capable of improving the yield rate of manufacture.

Briefly described, these and other objects of the present invention are accomplished by the provision of an improved semiconductor vibration detection device which includes a movable lever which is supported by the semicondcutor base with at lease one of its ends and includes a vibrating part that extends, with an incorporated electrode, approximately parallel to the semiconductor base, and a fixed electrode layer which is provided on the semiconductor base opposite to the movable lever. The movable lever has a triple layer structure in which the middle section is a polysilicon layer that is formed to be alkali-etching-proof and the top and the bottom layers sandwiching the middle layer are also of alkali-etching-proof.

BRIEF DESCRIPTION OF THE DRAWING

These are other objected, features and advantages of the present invention will be more apparent from the following description of a preferred embodiment, taken in conjunction with the accompanying drawings, in which.

DESCRIPTION OF THE PREFERRED EMBODIMENT

Figure 1:
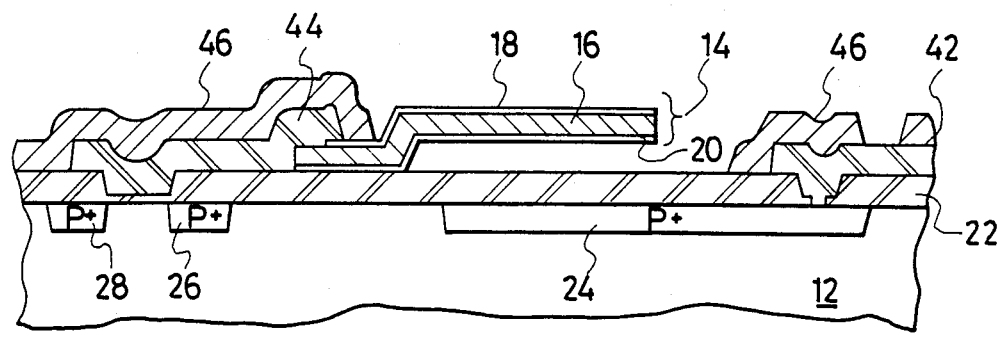
FIG. 1 is a cross section view of a semiconductor vibration detection device embodying the present inventions.

Referring to FIG. 1, there is shown a semiconductor vibration detection device embodying the present invention with the reference numeral 10.

The semiconductor vibration detection device 10 essentially comprises a semiconductor base 12 and a movable lever 14 with its own frequency of natural vibration which is installed on the semiconductor base 12 in the form of a cantilever. The movable lever 14 has a construction in which an alkali-etching-proof high density P+ polysilicon layer 16 that serves as an electrode layer is sandwiched by alkali-etching-proof nitride layers 18 and 20. Opposite to the movable lever 14, there is formed on the semicondcutor base 12 a P+ region 24 via a thermally oxidized $SiO^2$ layer 22. The P+ region 24, performing the function of a fixed electrode layer, forms a condenser together with the high density P+ polysilicon layer 16 of the movable lever 14. Therefore, if the movable lever 14 resonates to an external vibration, the capacity of the condenser varies in accordance with the changes in the separation between the movable lever 14 and the P+ region 24. Consequently, by setting up a circuit which can detect the variations in the capacity between the movable lever 14 and the P+ region 24, it is possible, by examining the output of the circuit, to determine whether there is applied to the movable lever 14 a vibration corresponding to the frequency of its natural vibration. Such a circuit for detecting the variations in the capacity can be formed compactly on the base 12 as a laminated form.

Now, the manufacturing processes for the semiconductor vibration detection device will be described by referring to FIGS. 2A through 2H.

Figure 2A:
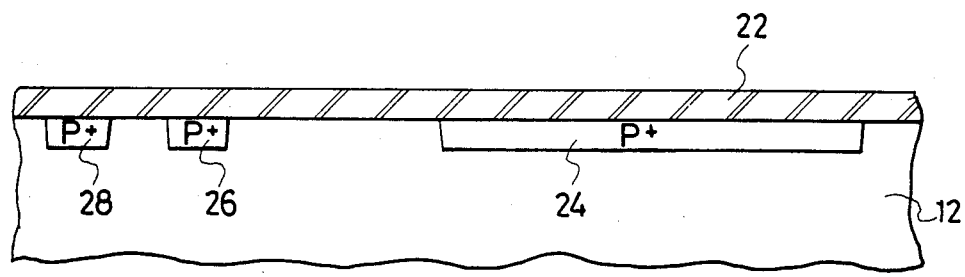
FIGS. 2A through 2H show processes for manufacturing the semicondcutor vibration detection device shown in FIG. 1.

As shown in FIG. 2A, P+ regions 24, 26, and 28, are formed in the base 12 of the N type Si. On the surface of the base 12 there is formed a layer of thermally oxidized $SiO_2$ to a thickness of, for example, 7000Å.

Figure 2B:
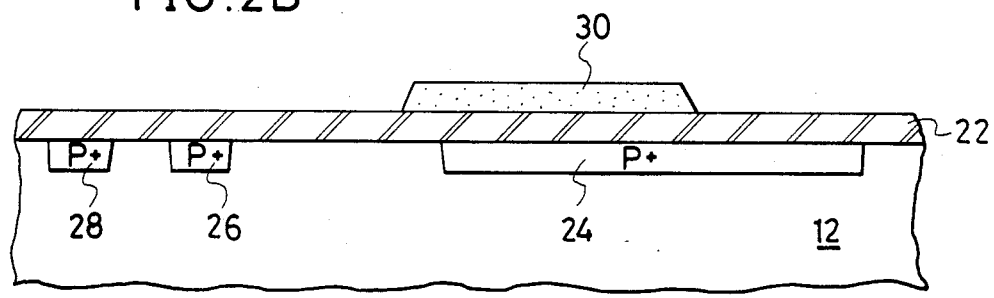

In FIG. 2B, all over the surface of the base 12, $SiH_4$ is thermally decomposed by the low pressure CVD method, for example, at a temperature of about 620° C.

to form an impurity-free polysilicon layer with thickness of 1 to 3 μm. Then a polysilicon spacer 30 is formed by photo-etching.

Figure 2C:
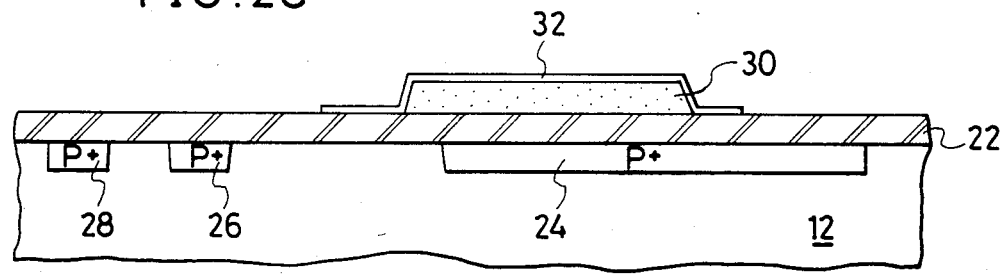

In FIG. 2C, next, a nitride layer of thickness of about 500Å is formed all over the surface of the base 12 by thermally decomposing NH₃ and SiH₂Cl₂ at about 750° C. by, for example, the low pressure CVD method. Then, an antioxidant layer 32 which deters the oxidation of the polysilicon spacer 30 is formed by photo-etching.

Figure 2D:
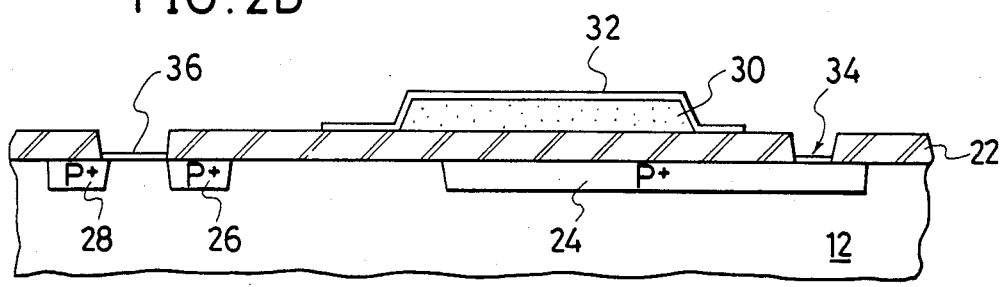

In FIG. 2D, the thermally oxidized SiO₂ layer 22 for the gate region and the contact region 34 of the P-MOS FET are removed by photo-etching, and an oxidized gate layer 36 is formed by thermal oxidation in an oxygen atmosphere of, for example, 1,050° C. Following this, an ion implantation through the oxidized layer for controlling the threshold voltage Vth may be carried out as needed.

Figure 2E:
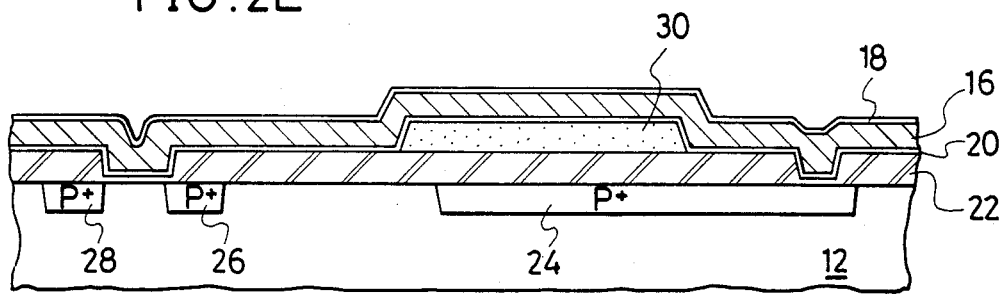

In FIG. 2E, after removal of the antioxidant layer 32 by hot phosphoric acid (150° C.), a bottom nitrode layer 20 with a thickness of about 300Å is formed all over the surface of the device, for example, by the low pressure CVD method. Then, a polysilicon layer of thickness between 5000Å and 10,000Å is formed all over the device by the low pressure CVD method, for example. The polysilicon layer is doped with a high-concentration bron by, for example, the impurity diffusion method using BBr₃ to form a high-concentration P+ polysilicon layer 16. Following this, a top nitride layer 18, which is about 20Å thicker than the bottom nitride layer 20, is formed all over the device surface by, for example, the low pressure CVD method.

Figure 2F:
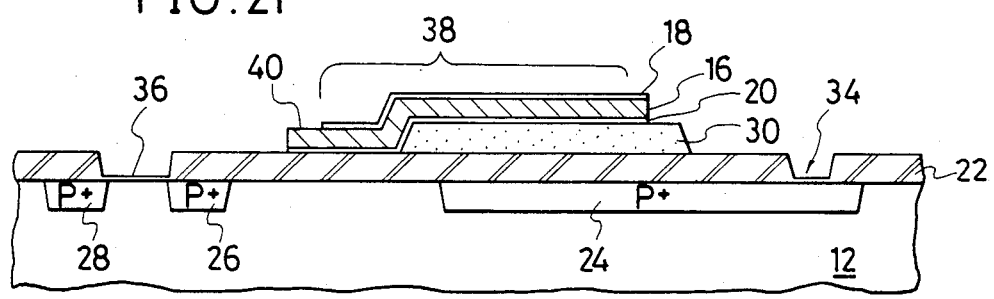

In FIG. 2F, a cantilever pattern 38 is then formed by plasma etching using CF₄, and the top nitride layer 18 for the electrode outlet 40 is removed by photo-etching.

Figure 2G:
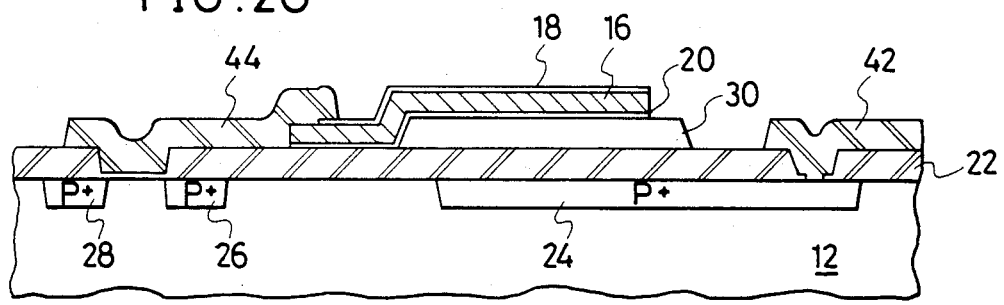

In FIG. 2G, a hole is created by photo-etching at the contact region 34 in the thermally oxidized layer. Then, an all over the device by, for example, the vacuum sputtering method, and the electrode wirings 42 and 44 are formed by photo-etching.

Figure 2H:
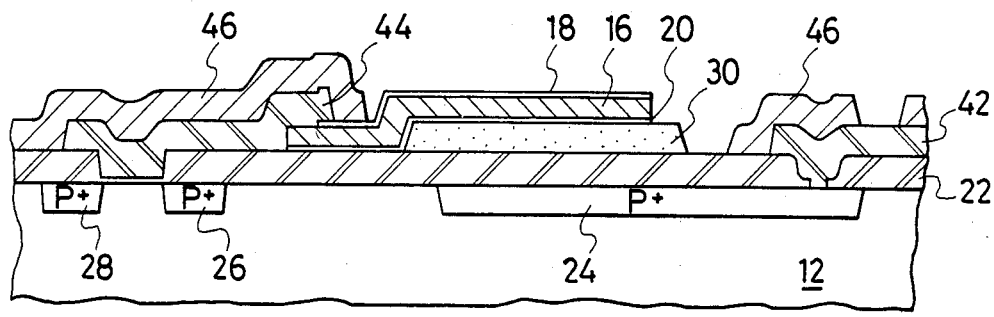

In FIG. 2H, a PSG layer with thickness of 1.2 μm, for example, is formed all over the device surface by thermally decomposing SiH₄ and PH₃ at about 400° C. by the normal pressure CVD method, for instance. Then, a protection layer 46 is formed by photo-etching except for the regions over the bonding pad and the movable lever. As the last step, the entire device surface is etched with an etching solution such as a strong alkaline water solution (a mixture of ethylenediamine, pyrocatechol, and water, for instance). With this process, the polysilicon spacer 30 which contains no boron is etched at a rate of about 50 μm/h, completing the semiconductor device as shwon in FIG. 1. During this process, the high-concentration P+ polysilicon layer 16 which represents the principal constituent of the movable lever 14 will hardly be etched sideways because of its high concentration of boron. Accordingly, the movable lever 14 can be manufactured with high accuracy.

It might be mentioned that the movable lever 14 can be made to have various shapes in the photo-etching process described in conjunction with FIG. 2F. For instance, the movable lever 14 may be made to have a shape in which its center of gravity is shifted toward the tip side of the lever from its lengthwise midpoint. Moreover, a slender hole may be created at the lengthwise midpoint of the movable lever 14 in order to have, during the final stage of the etching, the strong alkaline water solution to penetrate through the hole to reduce the time required for etching the polysilicon space 30 which is directly beneath the movable lever 14.

The semiconductor vibration detection device formed as described in the foregoing may be applied practically to the detection of engine knocking of the automotive vehicles, specific, vibrations of about 7 kHz are generated from the engine during the knocking. Therefore, for detecting knocking, the movable lever 14 needs be formed to have a frequency of natural vibration of 7 kHz. On the other hand, for applications to the acceleration sensor and the tachometer, the semiconductor vibration detection device has to be arranged in such a way as to have the acceleration and the centrifugal force to be exerted perpendicularly to the arm of the movable lever 14 in order to detect the capacity changes due to the acceleration and the centrifugal force.

Figure 3:
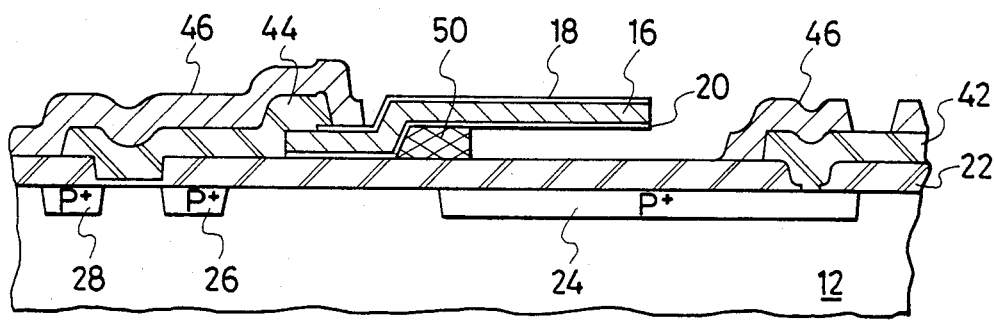
FIG. 3 is a cross section view of another embodiment of the semiconductor vibration detection device in accordance with the present invention.

Referring to FIG. 3, there is shown another embodiment of the semiconductor vibration detection device in accordance with the present invention. In this embodiment, the supporting region of the movable lever 14 is reinforced by the arranged formation of a high-concentration P+ polysilicon spacer 50.

Now, the manufacturing processes of the second embodiment of the semiconductor vibration detection device in accordance with the present invention will be described by referring to FIGS. 4A through 4I. Here, the processes for FIGS. 4A, 4B, and 4E through 4I are identical to those of FIGS. 2A, 2B, and 2D through 2H so that no further explanation will be given. Moreover, those parts that carry the same reference numerals as in FIGS. 1 and 2 signify the identical parts in these figures.

Figure 4A:
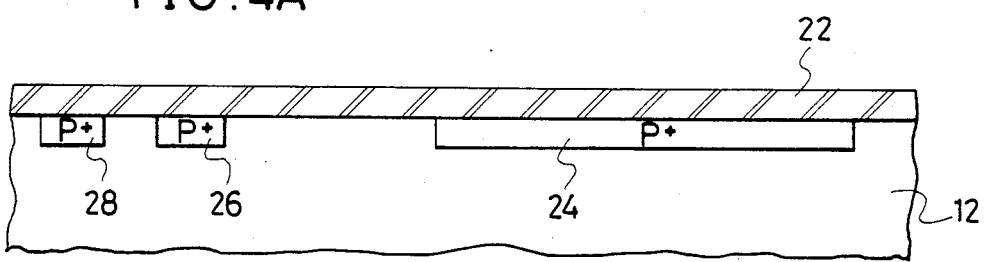
FIGS. 4A through 4H show the processes for manufacturing the semiconductor vibration detection device shown in FIG. 3.
Figure 4B:
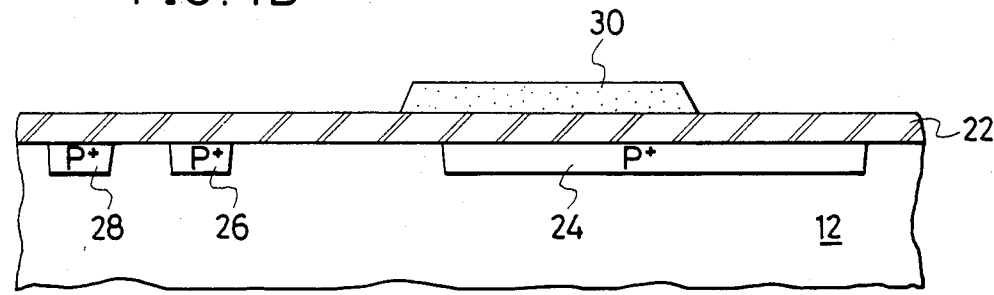
Figure 4C:
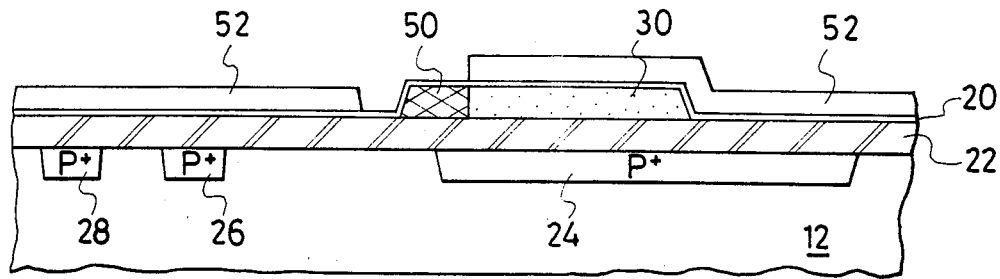

As shown in FIG. 4C, a bottom nitride layer of about 500 Å thickness is formed all over the device surface by the low pressure CDV method, for instance, through thermal decomposition of NH₃ and SiH₂Cl₂ at about 750° C. On top of it, there is formed an SiO₂ layer of about 7000Å thickness through thermal decomposition of SiH₄ at about 400° C. by, for example, the CVD method at the standard pressure. Then, an ion implantation masking 52 is formed by photo-etching through removal of the SiO₂ layer at the reinforcing region of the movable lever. Following this, a polysilicon spacer 50 is formed in the unmasked portion of the polysilicon spacer 30 by the ion implantation method through injection of boron ions with accelerated energy of 100 keV at the rate of $3 \times 10^{16}$ ions/cm².

Figure 4D:
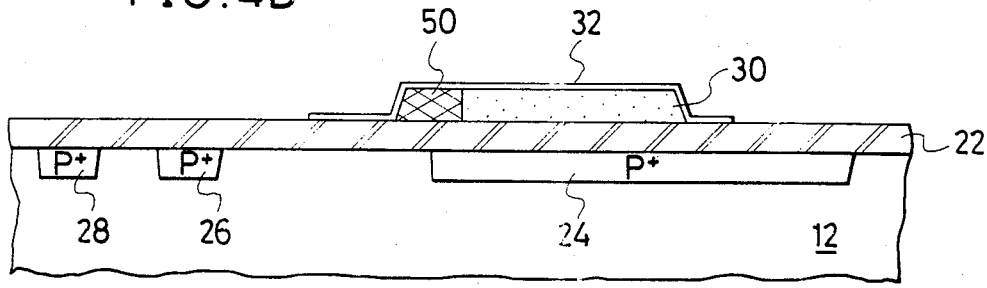
Figure 4E:
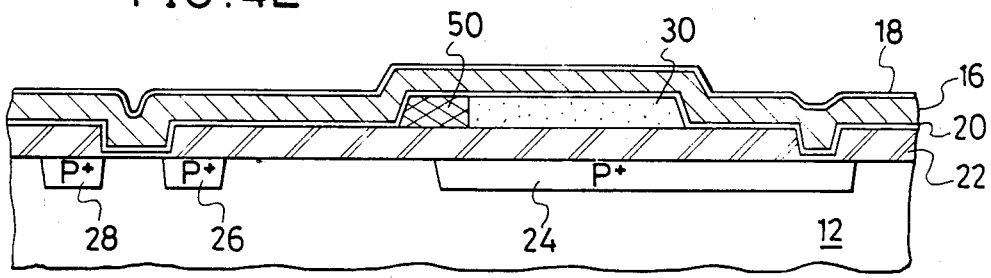
Figure 4F:
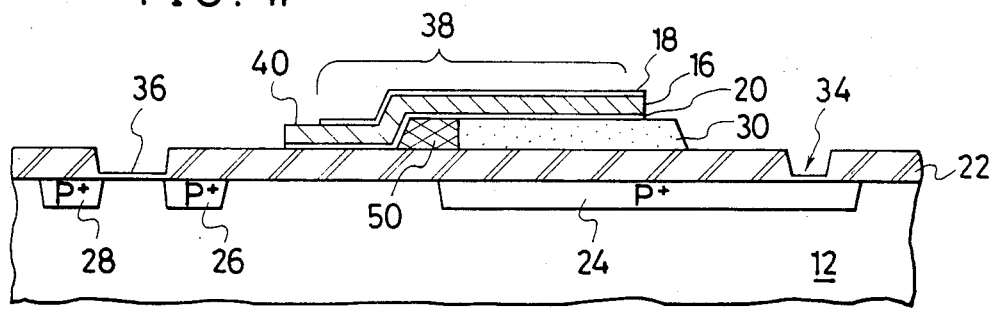
Figure 4G:
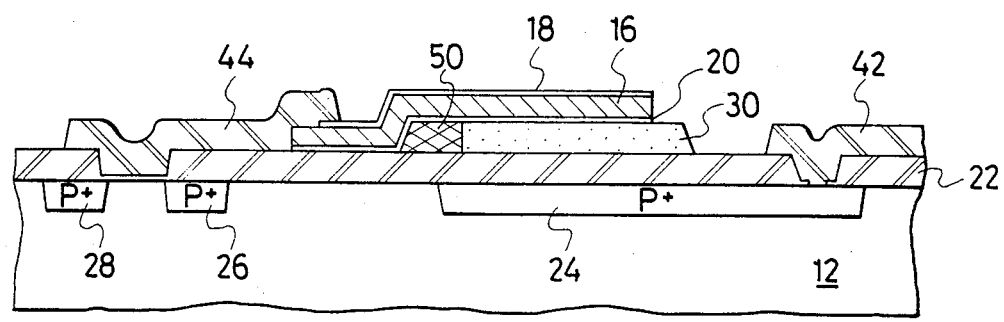
Figure 4H:
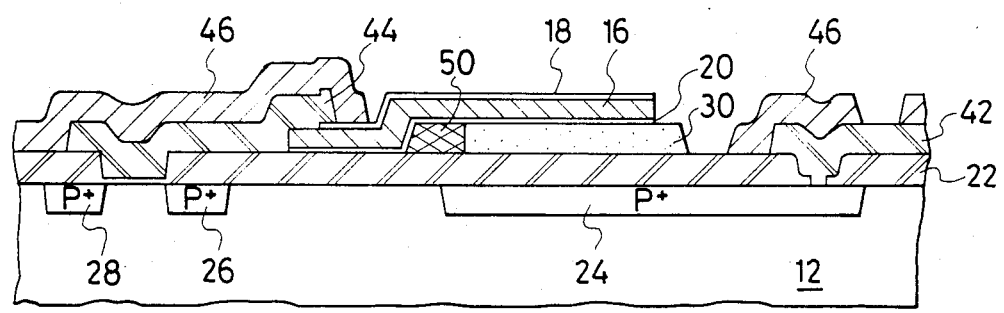

In FIG. 4D, the ion implantation masking 52 is etched away using dilated fluoric acid, and then an antioxidant layer 32 is formed by photo-etching to deter oxidation of the high concentration P+ polysilicon spacer 50 and the polysilicon spacer 30. Subsequent to this, via processes of FIGS. 4E through 4I, the polysilicon spacer 30 is etched away in the final stage with a strong alkaline water solution. During the final process, the rate of etching of the high concentration P+ polysilicon spacer 50 by the strong alkaline water solution stays at an extremely low value due to doping of boron at a high concentration. Therefore, the high concentration P+ polysilicon spacer 50 survives, completing the formation of the semicondcutor device as shown in FIG. 3.

Through reinforcement of the supporting region of the movable lever, it becomes possible to prevent the warping of the movable lever. Due to the increased strength against the lateral forces of the movable lever thus obtained, it becomes possible to suppress the objection that the movable lever tends to break, for example, during etching or washing with water. This leads to an improvement regarding the yield for the formation of the movable lever.

In summary, the semiconductor vibration detection device embodying the present invention includes a movable lever and an oppositly situated fixed electrode. The movable lever is fastened to the semiconductor base with at least one of its ends and includes a vibrating part which, incorporating an electrode as a unified body, extends approximately parallel to the semiconductor base. The fixed electrode is formed on the semiconductor base opposite to the vibrating part of the movable lever. Between the electrode on the movable lever and the fixed electrode there is formed a condenser. The movable lever has a triple layer structure in which a polypilicon layer that is formed to be alkali-etching-proof is covered by alkali-etching-proof materials on both sides. The device has the following features.

(1) In order to form the movable lever in the final stage, it is only necessary to etch away the polysilicon surrounding the movable lever with an alkaline etching solution. Then, the etching of polysilicon with an alkaline etching solution does not utilize anisotropy so that etching can proceed from all directions. Therefore, the formation of the movable lever can be accomplished in a short time (for instance, about 2 hours for a movable lever with a width of 100 μm) without regard to the length of the movable lever.

(2) By to the reduction in the etching time in the final stage, it now becomes possible to use inexpensive aluminum and PSG film as materials for electrodes and protecting layers, respectively, in spite of the fact that both substances possess certain etching rate against the alkaline etching solution. This will contribute to reduce the cost for manufacturing the seciconductor vibration detection device.

(3) Since anisotropy is not utilized in conjunction with the etching, there exists no requirement for installing an ultra-high precision orientation flat on the wafer and for carrying out the direction setting for each side of the pattern for the etching window. This circumstance facilitates the etching process, and makes it possible to manufacture the movable lever in a highly precise manner.

Various modifications will become possible for those skilled in the art after receiving the reachings of the present disclosure without departing from the scope thereof.

What is claimed is:

1. A vibration detection device for detecting machinery vibrations, comprising:
    a semiconductor base;
    a movable lever installed on said semiconductor base in the form of a cantilever to have a predetermined frequency of natural vibration, said movable lever includes two alkali-etching-proof nitride layers and an alkali-etching-proof high density P+ polysilicon layer which is vertically sandwiched by the alkali-etching-proof nitride layers; and
    a P+ region formed on said semiconductor base opposite to the movable lever.

2. A vibration detection device as claimed in claim 1, in which the P+ region is arranged to form a condenser together with the high density P+ polysilicon layer.

3. A vibration detection device as claimed in claim 2, in which the P+ region is opposed to said movable lever through a thermally oxidized $SiO_2$ layer.

4. A vibration detection device as claimed in claim 1, in which the high density P+ polysilicon layer has thickness between 5000Å and 10000 Å.

5. A vibration detection device as claimed in claim 4, in which the bottom nitrode layer has a thickness of about 300 Å.

6. A vibration detection device as claimed in claim 5, in which the top nitride layer is about 20Å thicker than the bottom nitride layer.

7. A vibration detection device as claimed in claim 1, further comprising
    a high density P+ polysilicon spacer arranged at a supporting region of the movable lever for reinforcing the supporting region.

* * * * *